United States Patent
Yamaguchi

(10) Patent No.: US 6,541,895 B2
(45) Date of Patent: Apr. 1, 2003

(54) PIEZOELECTRIC/ELECTROSTRICTIVE FILM ELEMENT

(75) Inventor: Hirofumi Yamaguchi, Komaki (JP)

(73) Assignee: NGK Industries, Ltd., Naogya (JP)

( * ) Notice: Subject to any disclaimer, the term of this patent is extended or adjusted under 35 U.S.C. 154(b) by 0 days.

(21) Appl. No.: 10/090,411

(22) Filed: Mar. 4, 2002

(65) Prior Publication Data

US 2002/0158550 A1 Oct. 31, 2002

(30) Foreign Application Priority Data

Mar. 2, 2001 (JP) ........................................ 2001-059118

(51) Int. Cl.⁷ .............................................. H01L 41/08
(52) U.S. Cl. ....................................... 310/324; 310/366
(58) Field of Search ................................. 310/366, 324, 310/330

(56) References Cited

U.S. PATENT DOCUMENTS 5,594,292 A * 1/1997 Takeuchi et al. ............ 310/324
6,448,623 B2 * 9/2002 Takahashi et al. .......... 257/414

* cited by examiner

Primary Examiner—Thomas M. Dougherty
(74) Attorney, Agent, or Firm—Burr & Brown

(57) ABSTRACT

A lower electrode on a substrate is continuously formed from one thick portion at the periphery to a thin diaphragm portion. An auxiliary electrode is continuously formed from a position of the thin diaphragm portion independent of the lower electrode to the other thick portion at the periphery. A piezoelectric/electrostrictive film is formed over the lower electrode and auxiliary electrode.

Since an incompletely bonded portion that can cause variation and time-dependent changes is not structured to extend over the thin diaphragm portion and the thick portions, it is possible to provide an element which has stable characteristics and which can be used under any condition. Further, since the incomplete bonded portion does not reside at ends of the thin diaphragm portion where the piezoelectric/electrostrictive film is likely to crack in the structure, it is possible to completely prevent the piezoelectric/electrostrictive film from cracking regardless of the type and characteristics of the film.

4 Claims, 3 Drawing Sheets

PIEZOELECTRIC/ELECTROSTRICTIVE FILM ELEMENT

This application claims the benefit of Japanese Application 2001-59118, filed Mar. 2, 2001, the entirety of which is incorporated herein by reference.

BACKGROUND OF THE INVENTION

This application claims the benefit of Japanese Application Number 2001-59118 filed Mar. 2, 2001, the entirety of which is incorporated herein by reference.

1. Field of the Invention

The present invention relates to piezoelectric/electrostrictive film elements, and in particular to piezoelectric/electrostrictive elements employed as actuators utilizing flexural displacement and sensors for detecting fluid properties, sound pressures, minute weights, acceleration, and so on, as for example, in microphones or viscosity sensors.

2. Description of the Related Art

Piezoelectric/electrostrictive film elements have conventionally been used as actuators and various types of sensors. A piezoelectric/electrostrictive film element used as a sensor is used for measuring the properties of a fluid such as the density, concentration, and viscosity as disclosed in Japanese Patent publication No. 5-201265A. Such elements are used as sensors because there is a correlation between the amplitude of a piezoelectric oscillator and the viscosity resistance of a fluid in contact with the oscillator. A mode of vibration in a mechanical system such as the vibration of an oscillator can be converted to an equivalent circuit in an electrical system. A piezoelectric/electrostrictive oscillator vibrates in a fluid, and receives a mechanical resistance based on the viscosity resistance of the fluid.

The oscillator thereby senses the variation of an electrical constant of an equivalent electrical circuit of the piezoelectric/electrostrictive element of the oscillator. As a result, it becomes possible to measure various parameters, which include the viscosity, density, and concentration of the fluid.

Fluids that can be measured include liquids and gases and include not only liquids consisting of a single component such as water, alcohol, and oils but also fluids composed of slurries, and pastes obtained by dissolving mixing or suspending soluble or in soluble media. Electrical constants to be detected include loss factor, phase, resistance, reactance, conductance, susceptance, inductance, and capacitance. In particular, preferred electrical constants are loss factors and phase because they have a single maximum or minimum point of variation near a resonance frequency of an equivalent circuit. This makes it possible to measure not only the viscosity of a fluid but also the density and concentration of the same. For example, the concentration of sulfuric acid in an aqueous solution of sulfuric acid can be measured through the use of the above electrical constants. In addition to the use of electrical constants, the variation in resonance frequency may also be utilized as an index for sensing variations in the mode of vibration, if there are no specific problems from the standpoint of precision of measurement and durability.

A conventional piezoelectric/electrostrictive film element is also disclosed in Japanese Patent publication 6-267742A.

An auxiliary electrode 8 is formed at a position independent of a lower electrode 4 on a substrate 1 which is made of ceramic having a thin diaphragm portion 3 and thick portion 2 on the periphery thereof as shown in FIGS. 3A, 3B, and 3C. A portion of the auxiliary electrode is positioned beneath a piezoelectric/electrostrictive film 5. As a result of this configuration, it is possible to improve the reliability of the connection of an upper electrode 6 through the continuous formation of the upper electrode on the face of the auxiliary electrode 8 and the piezoelectric/electrostrictive film 5 without any breakage. In FIGS. 3A, 3B, and 3C, a fluid to be measured is introduced into a cavity 10 via through hole 9.

Further, a piezoelectric/electrostrictive film element is disclosed in Japanese Patent publication 6-260694A. As shown in FIG. 3, a piezoelectric/electrostrictive film 5 is on a lower electrode 4 and is of a size that the surrounding portion of the piezoelectric/electrostrictive film 5 extends beyond the electrode 4 such that the periphery of the piezoelectric/electrostrictive film 5 projects above the ceramic substrate 1. As a consequence, it is not necessary to precisely position the lower electrode 4 and the piezoelectric/electrostrictive film 5, and thus short circuits between the upper and lower electrodes are easily prevented. Further, an extending portion 11 of the piezoelectric/electrostrictive film 5 can manifest sufficient flexural displacement, generation and vibration because it is in an incompletely bonded state with the substrate 1. The extended portion 11 is not bonded with the substrate due to the presence of incompletely bonded portions 7A.

An incompletely bonded state means that a portion of the extended portion 11 is either partially bonded with the ceramic substrate or that a portion an unbonded region without any bonded portion is in existence. Specifically, it is defined to mean that the peeling (tear off) strength of the film 5 to substrate 1 is 0.5 $kg/mm^2$ or less.

With respect to the formation of in unbonded state as described above, there are instances when it is necessary to have a low reactivity between the materials selected for the substrate and the piezoelectric/electrostrictive film. In this regard, it is also possible to form a dummy layer between the piezoelectric/electrostrictive film and the substrate so as to prevent their direct contact. The dummy layer is formed by a stamping method, a screen printing method or an ink jet method. The incompletely bonded portion 7A is formed when the dummy layer is subsequently dissolved. For example, the dummy layer is fabricated with combustible/removable materials, such as resin materials, which are dissolved away to form the incompletely bonded portions 7A when the piezoelectric/electrostrictive film 5 is heat treated. In the case where the piezoelectric/electrostrictive film and the upper electrode are not heat treated, the dummy layer is formed with a resin material to be dissolved in a composition such as water or organic solvents, etc. Accordingly, after the formation of either the piezoelectric/electrostrictive film alone or in conjunction with the upper electrode 6, the incompletely bonded portions 7A is formed by dissolving or removing the dummy layer.

In the case of such sensor elements whose electrical properties during vibration are detected to perform sensing, it is desirable that the electrical properties do not vary. In a conventional structure of piezoelectric/electrostrictive film elements, the electrical constants between the individual sensor elements tend to vary in both the initial phase and with the subsequent passage of time. In such cases, a bothersome fine-tuning process is required to insure the proper performance of the oscillator.

In particular, significant changes in the properties have sometimes occurred under sever conditions of use, e.g., high temperatures and humidity.

Further, cracks have sometimes occurred on a piezoelectric/electrostrictive film depending on the type of the material of the piezoelectric/electrostrictive film at edges of the thin diaphragm portion. Because the stresses originating from vibration or displacement of the thin diaphragm are likely to concentrate at this portion, it has resulted in breakage of the upper electrode to disable the element.

In conventional piezoelectric/electrostrictive film elements, an incompletely bonded portion 7B is formed over a thin diaphragm 3 and a thick portion of a substrate between a lower electrode 4 and an auxiliary electrode 8 as shown in FIG. 3B. The incompletely bonded portion 7B is in an incompletely bonded state similarly to the incompletely bonded portion 7A of the extended portion 11. Studying the conventional piezoelectric/electrostrictive film elements, we found that a time-passage variation or change in the incompletely bonded state of an incompletely bonded portion 7B is one of major factors that cause a change in a mode of variation, in the case of a sensor element or the like utilizing electrical constants during vibration. Further, such a change in a mode of variation consequently causes changes in electrical constants. Specifically, the incompletely bonded portion that has a low bonding force and low mechanical strength extends over the thin diaphragm and the thick portion. Since the thin diaphragm undergoes vibration or displacement and the thick portion is fixed, the incompletely bonded state cannot be established with high reproducibility and stability because of phenomena such as partial unbonded and micro-cracks. The micro-cracks thus generated can develop into a greater crack which can cause the piezoelectric/electrostrictive film to crack.

Further, in the structure shown in FIGS. 3A, 3B, and 3C, the piezoelectric/electrostrictive film sandwiched by the lower electrode and upper electrode continuously extends over the thin diaphragm and the thick portion. As a result, an electric field generated during a process of polarizing or driving the element will be applied to the region extending over the thin diaphragm and thick portion. It was found that this piezoelectrically activates edges of the thin diaphragm portion where stresses are likely to concentrate generate an additional stress that can result a crack.

SUMMARY OF THE INVENTION

The present invention relates to a piezoelectric/electrostrictive film element in which a lower electrode along with an auxiliary electrode, a piezoelectric/electrostrictive film, and an upper electrode are sequentially formed on a ceramic substrate having a thin diaphragm portion with thick portions on the periphery thereof. The lower electrode is formed to continuously extend over one thick portion on the periphery and the thin diaphragm portion. The auxiliary electrode is formed to continuously extend from a position of the thin diaphragm portion independent of the lower electrode to the other thick portion on the periphery. The piezoelectric/electrostrictive film is formed to extend over the lower electrode and the auxiliary electrode.

In the piezoelectric/electrostrictive film element, a piezoelectrically and electrostrictively active portion of the piezoelectric/electrostrictive film that is sandwiched between the upper electrode and the lower electrode preferably resides only in the thin diaphragm portion.

There is also provided a piezoelectric/electrostrictive film element as described above, characterized in that a bonding layer for bonding the piezoelectric/electrostrictive film and the thin diaphragm portion is provided between the lower electrode and the auxiliary electrode.

DESCRIPTION OF THE PREFERRED EMBODIMENT

Figure 1A:
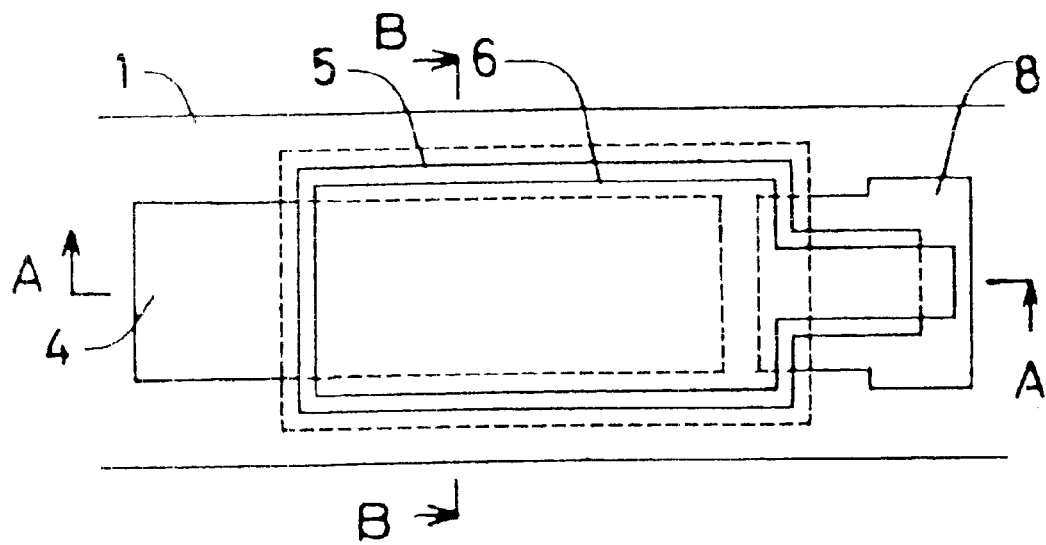
FIGS. 1A, 1B and 1C illustrate an embodiment of a piezoelectric/electrostrictive film element for a sensor according to the present invention.
Figure 1B:
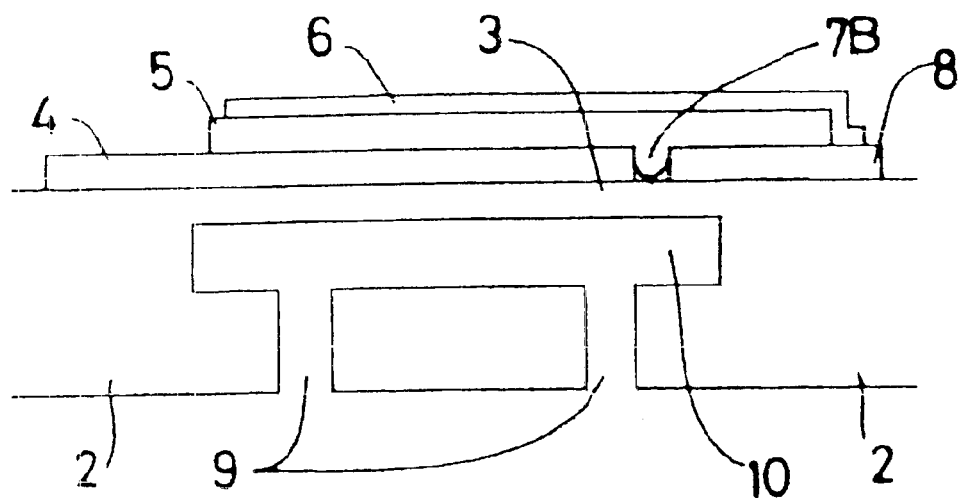
Figure 1C:
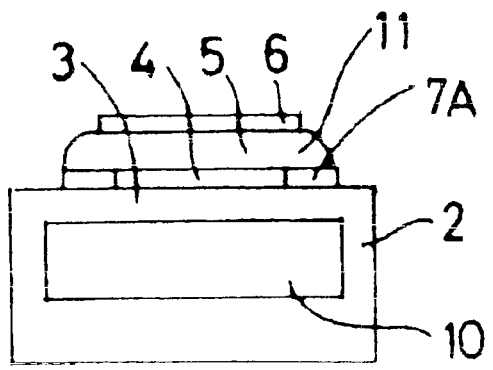
Figure 2:
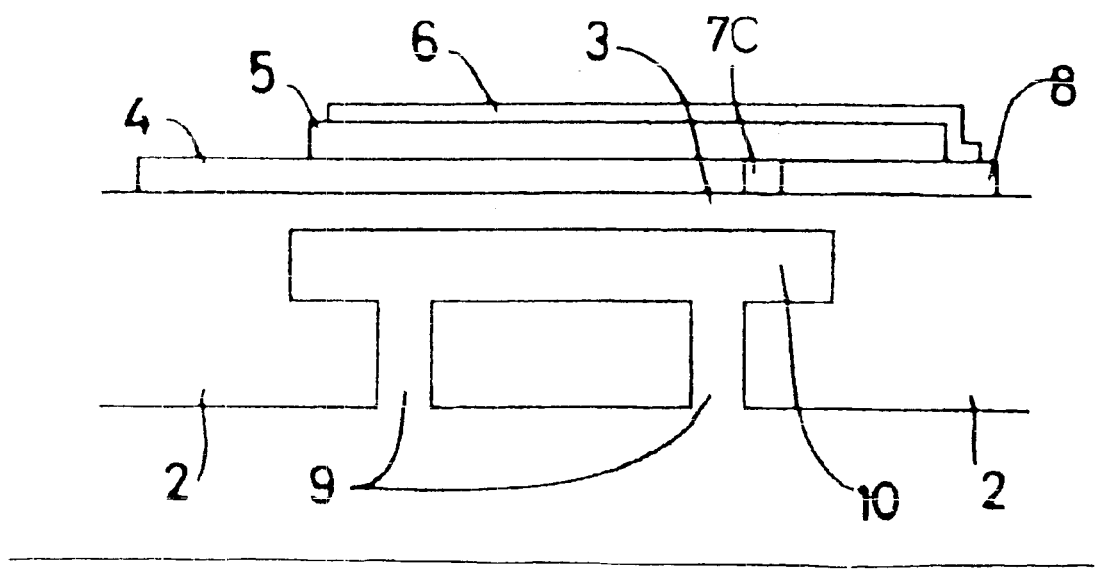
FIG. 2 illustrates another embodiment of a piezoelectric/electrostrictive film element for a sensor according to the present invention.
Figure 3A:
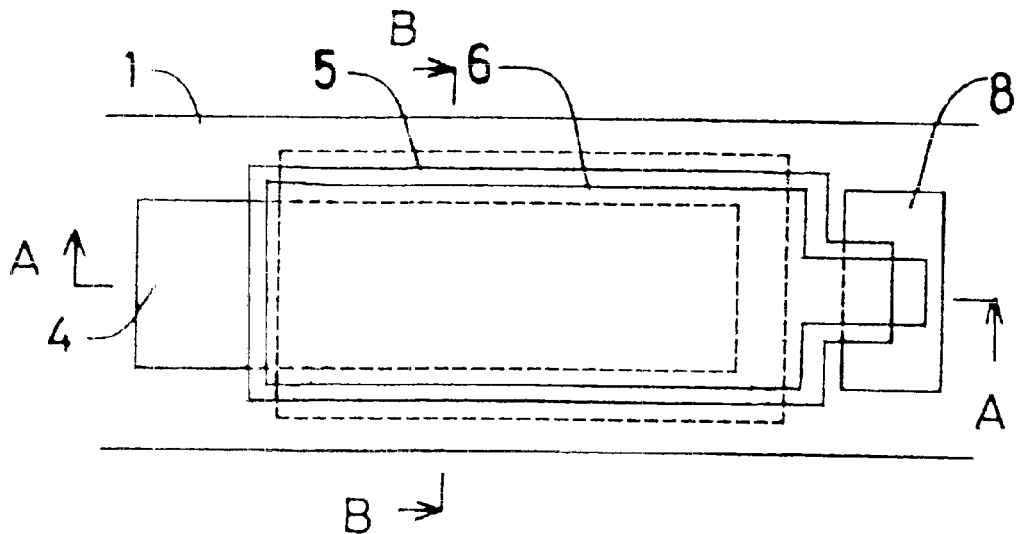
FIGS. 3A, 3B, and 3C illustrate a conventional piezoelectric/electrostrictive film element.
Figure 3B:
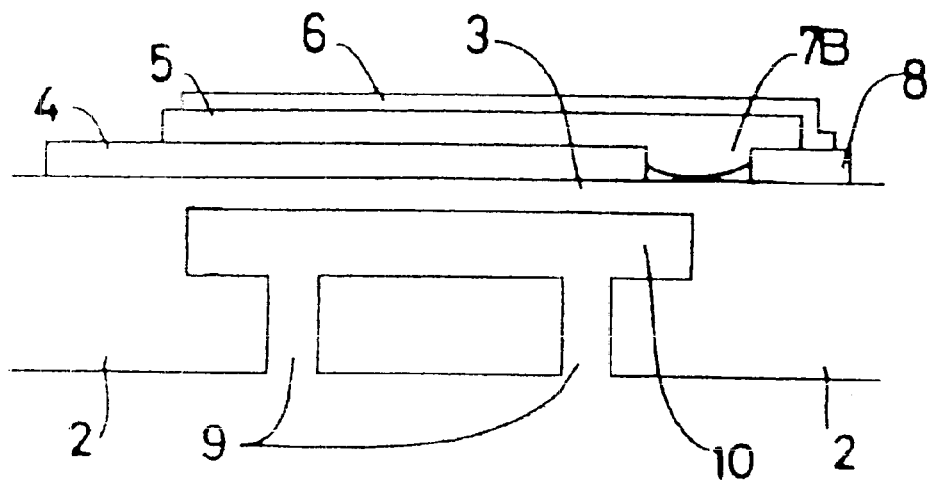
Figure 3C:
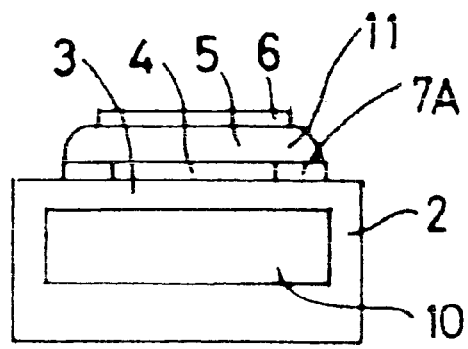

FIGS. 1A, 1B, and 1C show a piezoelectric/electrostrictive film element for a sensor that is an embodiment of the invention. Such a piezoelectric/electrostrictive oscillator is formed as an integral structure in which a lower electrode 4, a piezoelectric/electrostrictive film 5, and an upper electrode 6 are sequentially formed on a ceramic substrate 1. The substrate 1 comprises of a thin diaphragm portion 3 and thick portions 2 using a normal method of forming films. The lower electrode 4 is formed in a length at which one end of the same close to an auxiliary electrode 8 does not extend beyond the thin diaphragm portion 3. The auxiliary electrode 8 is formed on the same plane on which the lower electrode 4 is located. Also the auxiliary electrode is at a position of the thin diaphragm portion independent of the lower electrode such that it extends beneath the piezoelectric/electrostrictive film 5. The auxiliary electrode 8 is continuously formed with a predetermined length to extend from a thick portion 2 opposite to the lower electrode 4 to the thin diaphragm portion 3. The piezoelectric/electrostrictive film 5 is formed over the lower electrode 4 and the auxiliary electrode 8. The upper electrode 6 is formed over the piezoelectric/electrostrictive film 5 and the auxiliary electrode 8 to be in continuity to the auxiliary electrode 8. An incompletely bonded portion 7B is provided in proximity to only the thin diaphragm portion 3.

An extending portion 11 is not always present in the present invention, and the lower electrode 4 and piezoelectric/electrostrictive film 5 may be substantially the same size when seeking to reduce the variations in the electrical constants and the variation of the element properties over time.

The ceramic substrate 1 is preferably made of a material having heat resistance, chemical stability, and insulating properties. The reason for applying the above material is that a heat treatment may be performed when the lower electrode 4, piezoelectric/electrostrictive film 5, and upper electrode 6 are integrated. Another reason is that the piezoelectric/electrostrictive film element as a sensor element may be used to sense the properties of a conductive and corrosive liquid, as will be described later.

From such a point of view, for example, ceramics that can be used include stabilized zirconium oxide, aluminum oxide, magnesium oxide, mullite, aluminum nitride, silicon nitride, and glass. Above all, stabilized zirconium oxide is preferably used for reasons including its excellent toughness and its capability of maintaining high mechanical strength when the thin diaphragm portion is formed.

The thickness of the thin diaphragm portion 3 of the ceramic substrate 1 is 50 $\mu$m or less in general, preferably 30 $\mu$m or less and, more preferably 15 $\mu$m or less in order not to hinder the vibration of the piezoelectric/electrostrictive film. The thin diaphragm portion may have any surface configuration such as a rectangular, square, triangular, elliptic, or completely round configuration. Preferably, a rectangular or completely round configuration is chosen as occasion demands when the element is used as a sensor element in which the resonant mode to be excited must be simple.

The lower electrode 4 and auxiliary electrode 8 are formed on a surface of such a ceramic substrate 1. The lower electrode 4 is formed with a predetermined size that is equal to or smaller than the size of the piezoelectric/electrostrictive film 5 such that it extends from one end of the ceramic substrate on to the thin diaphragm portion 3. The auxiliary electrode 8 is formed such that it continuously extends from the end of the ceramic substrate 1 opposite to the lower electrode 4 to a predetermined position on the thin diaphragm portion 3. The ends of the lower electrode 4 and auxiliary electrode 8 on the thick portions are used as lead terminals.

The lower electrode 4 and auxiliary electrode 8 may be made of different materials or the same material, and a conductive material that can be well bonded to both of the ceramic substrate 1 and piezoelectric/electrostrictive film 5 is used. Specifically, platinum, palladium, rhodium, silver, or an electrode material primarily constituted by an alloy of such elements is preferably used. Especially, when a heat treatment for sintering is performed when the piezoelectric/electrostrictive film is formed, platinum and an alloy primarily constituted by the same are preferably used.

The lower electrode 4 and auxiliary electrode 8 are formed using various known methods for forming films. Specifically, while methods for forming thin films such as ion beam, sputtering, vacuum deposition, CVD, ion plating, and plating and methods for forming thick films such as screen printing, spraying, and dipping are appropriately selected, and sputtering and screen printing are preferably selected above all.

When a bonding layer for bonding the piezoelectric/electrostrictive film 5 and thin diaphragm portion 3 are provided between the lower electrode 4 and auxiliary electrode 8, a bonding layer 7C is formed in the position of an incompletely bonded portion 7B before forming the piezoelectric/electrostrictive film 5. The bonding layer 7C comprising an insulator may be made of either organic or inorganic material as long as it can be well bonded to and bonded with both of the piezoelectric/electrostrictive film 5 and ceramic substrate 1. In order to achieve reliable bonding, the thermal expansion factor of the material used as the bonding layer 7C is preferably in the middle of the thermal expansion factor of the substrate material and one of the material used for the piezoelectric/electrostrictive film 5. When the piezoelectric/electrostrictive film 5 is subjected to a heat treatment, a glass material is preferably used to form the bonding layer 7C because it can be well bonded to and bonded with both of the piezoelectric/electrostrictive film 5 and ceramic substrate 1. In particular, a glass material having a softening point equal to or higher than the temperature of the heat treatment on the piezoelectric/electrostrictive film 5 is more preferably used. The reason is that such a glass material bonds the piezoelectric/electrostrictive film 5 and substrate 1 more rigidly, and it is less vulnerable to deformation as a result of the heat treatment because of its high softening point.

The piezoelectric/electrostrictive film 5 can be made of $(Bi_{0.5}Na_{0.5})TiO_3$ to be described later or $(1-x)(Bi_{0.5}Na_{0.5})TiO_3-xKNbO_3$ (x represents a molar fraction that satisfies $0.x.0.06$) or a material primarily constituted by the same. In that case, a material primarily constituted by $(1-x)$ $(Bi_{0.5}Na_{0.5})TiO_3-xKNbO_3$ (x represents a molar fraction that satisfies $0.08.x.0.5$) is preferably used to form the bonding layer 7C because the layer will be well bonded to both of the piezoelectric/electrostrictive film 5 and ceramic substrate 1 and will prevent the piezoelectric/electrostrictive film 5 and substrate 1 from being adversely affected by the heat treatment. Specifically, when the bonding layer 7C is formed from $(1-x)(Bi_{0.5}Na_{0.5})TiO_3-xKNbO_3$ (x represents a molar fraction that satisfies $0.08.x.0.5$), it is well bonded to the piezoelectric/electrostrictive film 5 because it has components similar to those in the piezoelectric/electrostrictive film 5. Additionally, it is less vulnerable to problems caused by diffusion of different kinds of elements that are likely to occur when glass is used. Moreover, it well reacts with the substrate to allow rigid bonding because a great amount of $KNbO_3$ is included. Further, since $(1-x)(Bi_{0.5}Na_{0.5})TiO_3-xKNbO_3$ (x represents a molar fraction that satisfies $0.08.x.0.5$) exhibits substantially no piezoelectric characteristic, stable element properties can be achieved because the layer is not vibrated, displaced, or stressed by electric fields generated at the lower electrode 4 and auxiliary electrode 8 during use.

A normal method for forming thick films, in particular, stamping process or screen printing process is used for forming a bonding layer 7C. An inkjet process is preferably used when the size of the region to be formed is in the range from about several tens m to several hundred m. When the bonding layer 7C must be subjected to a heat treatment, the heat treatment maybe performed before the piezoelectric/electrostrictive film 5 is formed. Alternatively, the heat treatment may be performed concurrently with the formation of the piezoelectric/electrostrictive film 5.

The piezoelectric/electrostrictive film 5 is formed such that it extends over the lower electrode 4, auxiliary electrode 8, and bonding layer 7C with a size to cover the lower electrode 4. The piezoelectric/electrostrictive film may be made of any material that exhibits a piezoelectric/electrostrictive effect. Materials include lead type ceramic piezoelectric/electrostrictive materials such as lead zirconate, lead titanate, and lead titanate zirconate (PZT), barium titanate and barium titanate type ceramic ferroelectrics primarily constituted by the same, polymeric piezoelectric elements represented by polyvinylidene fluoride (PVDF), Bi-type ceramic piezoelectric elements represented by $(Bi_{0.5}Na_{0.5})TiO_3$, and Bi layered ceramics. Obviously, mixtures or solid solutions of such elements having improved piezoelectric/electrostrictive characteristics may be used, and the elements may be used with additives added therein. A PZT type piezoelectric element is preferably used as the material of a sensor capable of detection with high sensitivity and having high piezoelectric peoperties. According to the invention, it is preferable to use a material primarily constituted by one or more elements selected from among lead titanate, lead zirconate, lead magnesium niobate, and lead nickel niobate. One of the reasons is that the material is reluctant to react with the material forming the substrate. Another reason is that the material is less vulnerable to segregation of components during a heat treatment. Further, the material can be well processed to maintain the composition, which makes it possible to obtain a desired composition and crystal structure easily.

When platinum or an alloy primarily constituted by platinum is used for the lower electrode 4 and auxiliary electrode 8, $(Bi_{0.5}Na_{0.5})TiO_3$ or a material primarily constituted by the same is preferably used because the material can be bonded to the electrodes more excellently and the material results in reduced variation of the characteristics of the element to provide high reliability. Among such materials, (1−x) (Bi$_{0.5}$Na$_{0.5}$)TiO$_3$–xKNbO$_3$ (x represents a molar fraction that satisfies 0.x.0.06) or a material primarily constituted by the same is more preferably used because it has relatively high piezoelectric characteristics.

Such a piezoelectric/electrostrictive material is formed into the piezoelectric/electrostrictive film 5 using various known methods for forming films similarly to the lower electrode 4 and auxiliary electrode 8. Above all, screen-printing is preferably used because of low cost.

The piezoelectric/electrostrictive film 5 thus formed is subjected to a heat treatment as occasion demands and is integrated with the lower electrode 4, auxiliary electrode 8, and bonding layer 7C. When it is necessary to bond the piezoelectric/electrostricitve film 5, lower electrode 4, auxiliary electrode 8, a bonding layer 7C more rigidly to suppress variation of the characteristics of the element to achieve higher reliability, (Bi$_{0.5}$Na$_{0.5}$)TiO$_3$or a material primarily constituted by the same is preferably used. In particular, (1−x) (Bi$_{0.5}$Na$_{0.5}$)TiO$_3$–xKNbO$_3$ (x represents a molar fraction that satisfies 0.x.0.06) or a material primarily constituted by the same is used. Additionally, those materials are preferably subjected to a heat treatment at a temperature in the range from 900° C. to 1400° C. and, more preferably, in the range from 1000° C. to 1300° C. This holds true for a PZT type material. At this time, the heat treatment is preferably performed while controlling the source of vaporization of the piezoelectric/electrostrictive material and the atmosphere in order to prevent the piezoelectric/electrostrictive film 5 becoming unstable at high temperatures.

The upper electrode 6 is continuously formed on the piezoelectric/electrostrictive film 5 thus formed such that it extends over the piezoelectric/electrostrictive film 5 and auxiliary electrode 8.

The upper electrode 6 is made of a conductive material that can be well bonded to the piezoelectric/electrostrictive film 5, and is formed using the same method for forming films that is used for the lower electrode 4 and auxiliary electrode 8.

Further, the upper electrode 6 is subjected to a heat treatment, as occasion demands after it is formed and is bonded to the piezoelectric/electrostrictive film 5 and auxiliary electrode 8 to provide an integral structure. Such a heat treatment is in essential as it is for the lower electrode 4.

When the lower electrode 4, bonding layer, piezoelectric/electrostrictive film 5, and upper electrode 6 are bonded through a heat treatment, they may be subjected to the heat treatment each time they are formed or may be simultaneously subjected to the heat treatment after forming them sequentially. Obviously, an appropriate temperature is chosen for the heat treatment to achieve high bondability and to suppress alteration as a result of diffusion of the constituent elements. While the through holes 9 are formed in continuity to the cavity 10, there is no restriction on the structure below the cavity 10 inclusive in which the element is in contact with a fluid. It may be used any structure such as a simple cavity structure having no lid section.

Further, the piezoelectric/electrostrictive film 5 may have a length at which the end thereof closer to the auxiliary electrode 8 does not exceed the thin diaphragm portion 3 such that the film 5 does not extend over the thick portions 2.

A piezoelectric/electrostrictive element in the first aspect of the invention provides stable element properties because the incompletely bonded portion that can cause variation and time-dependent changes is not structured to extend over the thin diaphragm portion and thick portions. As a result, the element can be used under any condition. Since it has a structure in which the incompletely bonded portion does not reside at the edge of the thin diaphragm where the piezoelectric/electrostrictive film is likely to crack, stresses are dispersed through the lower electrode or auxiliary electrode at the edge of the thin diaphragm portion. Therefore, the element is able to completely prevent the piezoelectric/electrostrictive film from cracking regardless of the type and characteristics of the piezoelectric/electrostrictive film. It is therefore possible to obtain an element for determining the properties of a fluid and for discriminating between gasses and liquids by detecting electrical constants during vibration or an oscillator that reliably and stably works as an element for measuring sound pressures, very small weights, acceleration, and so on. Since a wide range of piezoelectric/electrostrictive materials can be chosen depending on required properties, there is provided advantages including easier improvement of properties and increased flexibility in designing.

In addition to the advantages in the first aspect of the invention, the piezoelectric/electrostrictive element in the second aspect of the invention completely prevents the piezoelectric/ electrostrictive film from cracking. The reason is that the element has a structure in which the piezoelectrically and electrostrictively active portion of the piezoelectric/electrostrictive film to which an electric field is applied resides only on the thin diaphragm portion.

Further, in the piezoelectric/electrostrictive element in the third aspect of the invention, it is possible to determine the properties of a fluid and for discriminate between gasses and liquids by detecting electrical constants during vibration, an element for measuring sound pressures, very small weights, acceleration, and so on. An element that is suitably works as an actuator element. Because the piezoelectric/electrostrictive film and substrate are incompletely bonded between the lower electrode and auxiliary electrode, it is possible to eliminate any variation and time-dependent change of vibration.

What is claimed is:

1. A piezoelectric/electrostrictive film element in which a lower electrode along with an auxiliary electrode, a piezoelectric/electrostrictive film, and an upper electrode are sequentially formed on a substrate made of ceramic having a thin diaphragm portion with thick portions on the periphery thereof, wherein the lower electrode is formed such that it continuously extends over one thick portion on the periphery and the thin diaphragm portion; the auxiliary electrode is formed such that it continuously extends from a position of the thin diaphragm portion independent of the lower electrode to the other thick portion on the periphery; and the piezoelectric/electrostrictive film is formed to extend over the lower electrode and the auxiliary electrode.

2. A piezoelectric/electrostrictive element according to claim 1, wherein a piezoelectrically and electrostrictively active portion of the piezoelectric/electrostrictive film that is sandwiched between the upper electrode and the lower electrode resides only in the thin diaphragm portion.

3. A piezoelectric/electrostrictive element according to claim 1, comprising a bonding layer for bonding the piezoelectric/electrostrictive film and the thin diaphragm portion provided between the lower electrode and the auxiliary electrode.

4. A piezoelectric/electrostrictive element according to claim 2, comprising a bonding layer for bonding the piezoelectric/electrostrictive film and the thin diaphragm portion provided between the lower electrode and the auxiliary electrode.

* * * * *

UNITED STATES PATENT AND TRADEMARK OFFICE
CERTIFICATE OF CORRECTION

PATENT NO.    : 6,541,895 B2
DATED         : April 1, 2003
INVENTOR(S)   : Hirofumi Yamaguchi It is certified that error appears in the above-identified patent and that said Letters Patent is hereby corrected as shown below:

<u>Title page,</u>
Item [73], Assignee: please change "NGK Industries, Ltd., Naogya (JP)" to -- NGK Insulators, Ltd., Nagoya (JP) --

Signed and Sealed this

Twenty-ninth Day of July, 2003

JAMES E. ROGAN
*Director of the United States Patent and Trademark Office*